United States Patent [19]

Wickham

[11] 4,316,321

[45] Feb. 23, 1982

[54] METHOD AND APPARATUS FOR ALIGNING AND PRESS-FITTING CONNECTOR TERMINALS INTO A SUBSTRATE

[75] Inventor: Thomas J. Wickham, Lakeville, Minn.

[73] Assignee: Magnetic Peripherals Inc., Minneapolis, Minn.

[21] Appl. No.: 115,839

[22] Filed: Jan. 28, 1980

[51] Int. Cl.³ .............................................. H05K 3/30
[52] U.S. Cl. ...................................... 29/845; 29/739; 29/759; 29/884; 227/136
[58] Field of Search ................. 29/739, 741, 845, 842, 29/884, 759; 227/136

[56] References Cited

U.S. PATENT DOCUMENTS 4,014,488  3/1977  Potucek et al. .................... 227/136
4,270,267  6/1981  Bakermans ...................... 29/739 X

*Primary Examiner*—Carl E. Hall
*Attorney, Agent, or Firm*—Robert M. Angus; Joseph A. Genovese

[57] ABSTRACT

A method and apparatus is provided for aligning and press-fitting connector terminals into a substrate. The terminals are initially supported together by a bandolier strip, and an alignment tool aligns the terminals with apertures in the substrate to which the terminals will be press-fitted. A pressing tool engages the shanks of the terminals to fold the bandolier away from the terminals and thereafter press the terminals into the apertures.

13 Claims, 15 Drawing Figures

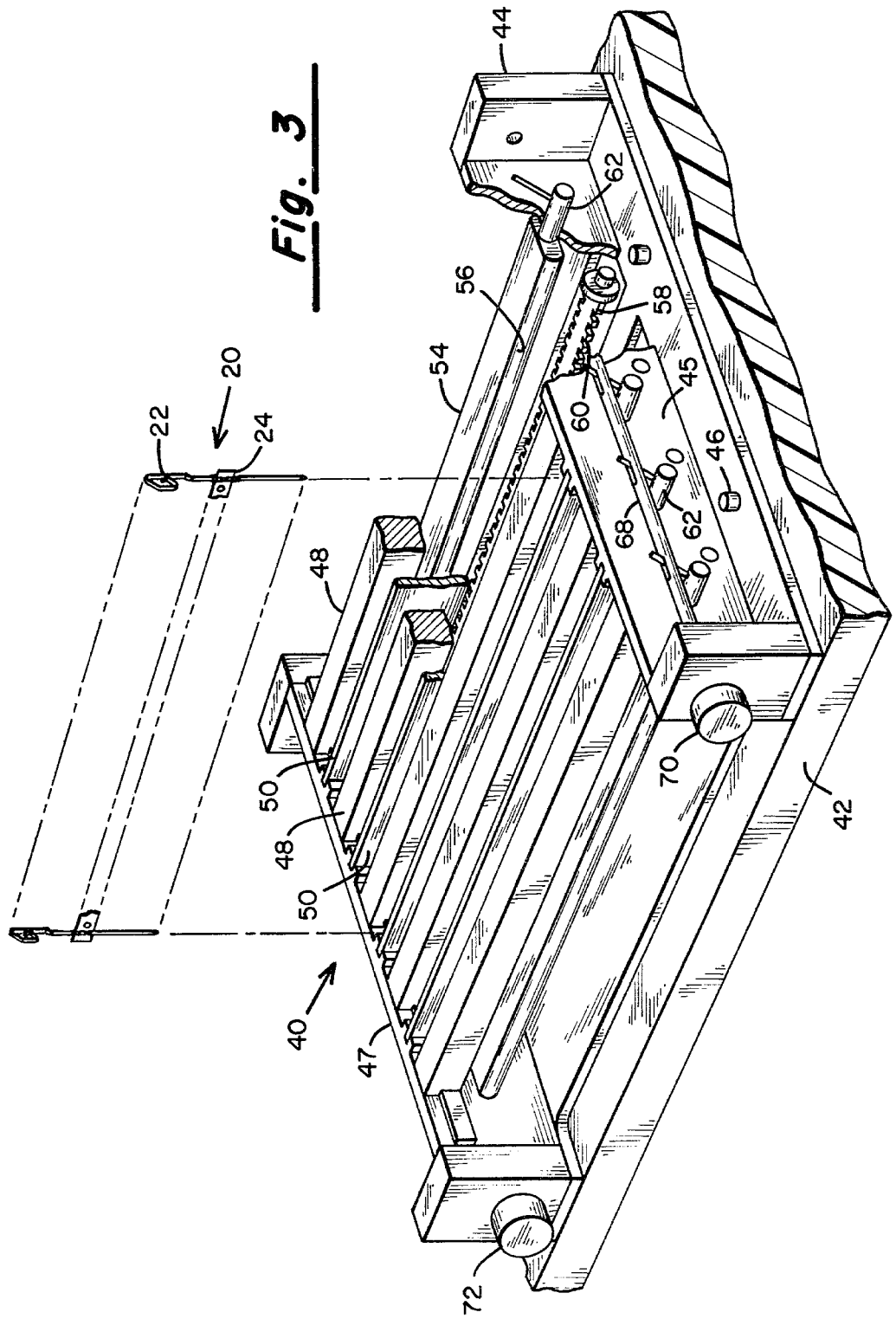

METHOD AND APPARATUS FOR ALIGNING AND PRESS-FITTING CONNECTOR TERMINALS INTO A SUBSTRATE

This invention relates to a method and apparatus for mounting a plurality of connector terminals on a board, such as a circuit board, mother board, back panel or the like, and particularly to a rapid and inexpensive technique for press-fitting a plurality of connector terminals into preformed apertures in such boards. The invention is particularly useful in assembling connector terminals to boards to form circuit board edge connectors to which other circuit boards may be electrically and mechanically mounted for connection to the mother board, back panel or the like.

In U.S. Pat. No. 4,094,573 granted June 13, 1978 to Arvin L. Langham for "Circuit Board Edge Connector" there is described a circuit board edge connector in which a plurality of connector terminals, press-fitted to a mother board or back panel, have bellows contacts having loop head portions which bias against a shoulder of the insulator housing of the connector assembly to thereby hold the housing against the mother board or back panel. A cavity or slot between opposite bellows heads of the connector terminals receives the edge of a circuit board, thereby establishing electrical contact and mechanical support between the circuit board and the mother board or back panel. The present invention is particularly useful for assembling the connector terminals to the mother board or back panel to form the connector assembly described in the aforesaid Langham patent, and accordingly, the description set forth in the Langham patent is hereby incorporated by reference.

In the past, the principal manner by which connector terminals had been mounted into preformed apertures in the mother board or back panel was by individually inserting the terminals by hand and press-fitting the same into the apertures. The problem with such technique is that it is slow, expensive, and damage often occurred in the terminals due to inept dexterity on the part of the assembler. Automated equipment for simultaneously inserting a plurality of terminals into the mother board or back plane has been available, but such equipment requires manual loading of the individual terminals, so that using such automated equipment is also a slow and expensive process. In U.S. Pat. Nos. 3,676,926 and 3,769,679 granted July 18, 1972 and Nov. 6, 1973, respectively, to Jerry A. Kendall for a "Method and Apparatus for Manufacturing Connector Terminals", there is described a technique whereby a plurality of connector terminals are formed from a common strip of metal with a frangible section between the individual terminals and the common strip. An insertion tool is brought into engagement with the common strip such that extended fingers bear against shoulders on the individual terminals so that when pressure is applied the fingers press against the terminals shoulders to press-fit the terminals into preformed apertures in the mother board. A breaking tool is thereafter fitted over the common strip to break the common strip away from the individual terminals. The technique described in the Kendall patents is utilized primarily to form connector assemblies as described in U.S. Pat. No. 3,671,917 granted June 20, 1972 to John P. Ammon and Fredrick T. Inacker for "Printed Circuit Board Connector".

The principal problems with the insertion technique described in the Kendall patents are that (1) the technique is not useful for inserting terminals with bellows contacts (i.e., of the type described in the aforementioned Langham patent), and (2) the breaking away of the common strip results in a rough edge at the frangible interface of the individual terminals which can damage circuit boards later to be inserted in the connector assembly being formed. Further, if the location of the frangible portion between the individual terminals and the common strip is not closely controlled, terminals can be broken in the wrong place upon breaking away of the common strip, thereby rendering inoperative part or all of the connector assembly.

The present invention is concerned with a technique for assembling a plurality of connector terminals to a mounting substrate (i.e., a mother board, back panel or the like) which avoids the problems associated with the Kendall approach and is useful for mounting terminals having bellows contacts for constructing connector assemblies described in the Langham patent.

Accordingly, it is an object of the present invention to provide a method and apparatus for inserting a plurality of connector terminals to a substrate (i.e., mother board or back panel) whereby the individual terminals are assembled to a removable bandolier so that upon removal of the bandolier the individual terminals remain intact and undamaged.

Another object of the present invention is to provide a method and apparatus for inserting a plurality of connector terminals to a substrate in which no rough or sharp edges are left on the terminals after removal of the bandolier.

Another object of the present invention is to provide a method and apparatus for inserting a plurality of connector terminals having bellows contact heads into a mounting substrate without damaging the contact heads.

In accordance with the present invention, a plurality of connector terminals are fastened together by a removable bandolier. The position of the terminals along the length of the bandolier is approximately the same as the space between apertures to which they will be assembled to the substrate. For example, the bandolier may be assembled to the shanks of the terminals, preferably in the region of an enlarged section on the shanks which will be press-fitted into the apertures. An alignment tool is positioned on the mounting substrate and includes a slot into which the terminals, supported by the bandolier, may be inserted. The alignment tool simultaneously aligns the terminals so that the shanks may be inserted into the apertures in the substrate. Thereafter, the alignment tool is removed, leaving the connector terminals in a position such that the terminals are partly inserted into the apertures, but not in full assembly position. An insertion tool is thereupon positioned over the terminals to remove the bandolier and press-fit the terminals to the assembly position wherein the enlarged sections on the shanks are interference fitted in the apertures.

In accordance with one feature of the present invention, the alignment tool includes a housing capable of being removably mounted to the substrate with one or more slot pairs into which the bandolier-held terminals may be inserted. Positioning means and loading means, supported by the housing, engage the shanks of the terminals in the slot pairs to align the shanks with preformed apertures in the substrate. Spacer means is provided to space apart opposing bellows contact heads.

Another feature of the present invention resides in the provision of a plurality of slot pairs in the housing of the alignment tool so that connector terminals for a plurality of connector assemblies may be mounted to the mounting substrate without repositioning the tool.

Another feature of the present invention resides in the provision of an insertion tool for press-fitting the aligned terminals to the substrate and for removing the bandolier.

Another feature of the present invention resides in a cam mechanism for fitting over the aligned terminals to press against the bandolier and terminals to remove the bandolier while press-fitting the terminals to the substrate.

The above and other features will be more fully understood from the following detailed description and the accompanying drawings, in which:

FIG. 3 is a broken perspective view of an alignment tool for aligning the terminals to be assembled to the substrate;

Figure 1:
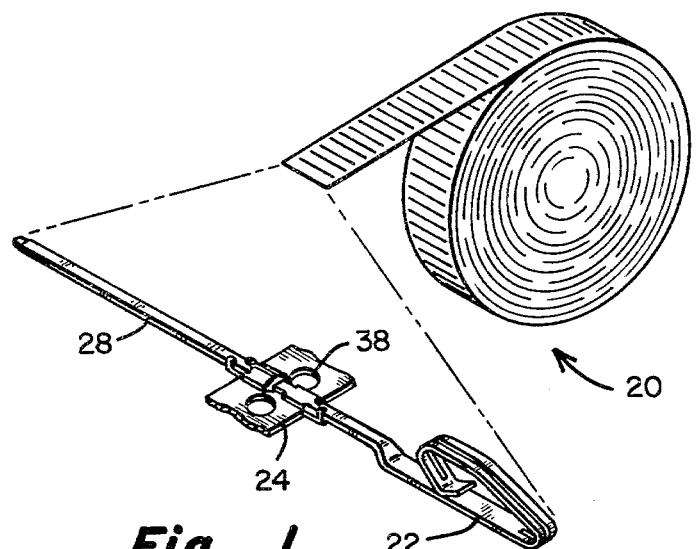
FIGS. 1 and 2 illustrate a typical connector terminal and bandolier assemblage for use with the tools to assemble the terminals to a mounting substrate.
Figure 2:
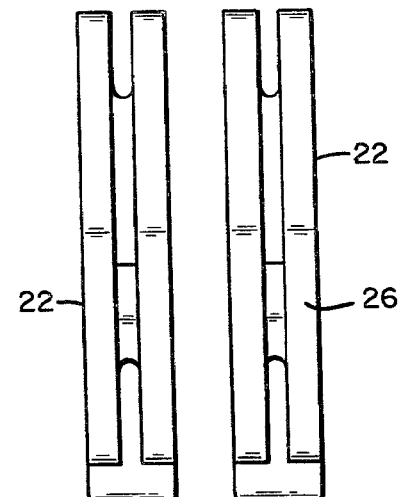

Referring to the drawings, and particularly to FIGS. 1 and 2, there is illustrated an assemblage 20 consisting of a plurality connector terminals 22 fastened together by bandolier 24 to form a continuous strip of connectors. Connector terminals 22 are identical to the terminals described in the aforementioned Langham patent, and include a bellows contact head 26 and an elongated shank 28. Shank 28 includes enlarged section 30 for press fitting into apertures in a back panel, mother board or mounting substrate as described in the aforementioned Langham patent. Enlarged section 32 forms shoulders 33 for purposes hereinafter described. Bandolier 24 is a separate flexible strip having openable crimp sections 34 and 36 having arms 35 crimped about portions of shank 28 of the connector terminals on opposite sides of enlarged sections 30 and 32. Bandolier 24 also includes a plurality of apertures 38 which, as will be more fully understood hereinafter, form fatigue sections for the bandolier. Arms 35 of crimp sections 34 and 36 hold the shanks 28 of the connector terminals to the bandolier 24 and are arranged to bend to an open position to release the connector terminal when stress is applied to the arms, thereby separating the bandoliers from the connector terminals. Typically, and as shown particularly in FIG. 1, the assemblage 20 consisting of the connector terminals and bandoliers may conveniently be packaged in rolls on a continuous bandolier strip so that a bandolier may be severed, preferably through a respective aperture 38 to form an assemblage 20 of desired length containing a desired number of connector terminals to be assembled to the mounting substrate, mother board or back panel for construction of the connector assembly described in the aforementioned Langham patent.

With reference particularly to FIGS. 3–6, there is illustrated an alignment tool 40 for aligning and initially inserting the connector terminals into respective apertures in the mounting substrate 42. Alignment tool 40 includes a frame 44 adapted to be mounted to substrate 42 and held in position by locator pins 46. Rigidly mounted to frame 44 are a plurality of spacer bars 48 extending along a line adjacent to a row of apertures 52 in substrate 42 (see FIGS. 4 and 6). Midway between and approximately parallel to spacer bars 48 are separator plates 50. As will be more fully understood hereinafter, separator plates 50 are approximately midway between two rows of apertures 52 (see FIG. 6) which will receive contact pairs to form a connector assembly as shown in the aforementioned Langham patent.

A plurality of load rods 54 each having opposite flat portions forming an arcuate surface 56 are rotatably mounted to the end plates 45 of frame 44. As shown particularly in FIG. 6, load rods 54 are positioned below spacer bars 48. A plurality of positioning rods 58 are rotatably mounted to the end plates 45 of frame 44 in a position immediately below separator bars 50. Positioning rods 58 are relatively flat and include notches 60 capable of receiving individual shanks 28 of connector terminals 22.

Figure 5:
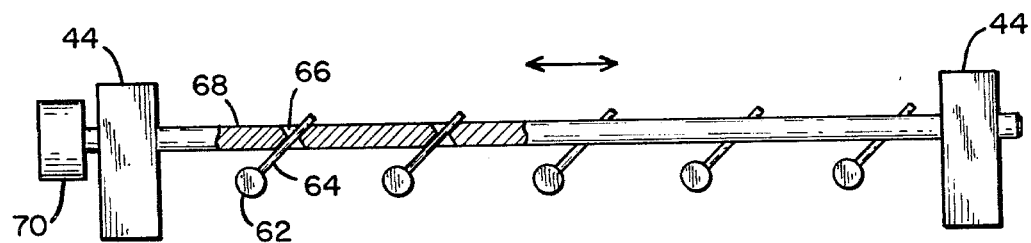

Each of the load rods 54 have extended shafts 62 extending through an end plate 45 of frame 44. Pins 64 are mounted to each of shafts 62 and extend through slots 66 of actuator rod 68 (FIG. 5). Actuator rod 68 is slidably mounted to frame 44 and includes a knob 70 for slidably moving actuator rods 68 in a longitudinal direction. As shown in FIG. 5, slots 66 receive pins 64 so that upon actuation of knob 70 and actuator rods 68, the pins 64 travel within slots 66 to rotate shafts 62 90° between a first position shown in solid lines in FIG. 6 and a second position shown in dashed lines in FIG. 6 so that load rods 54 may be rotated to a position wherein the arcuate surfaces 56 bear against shanks 28.

Figure 6:
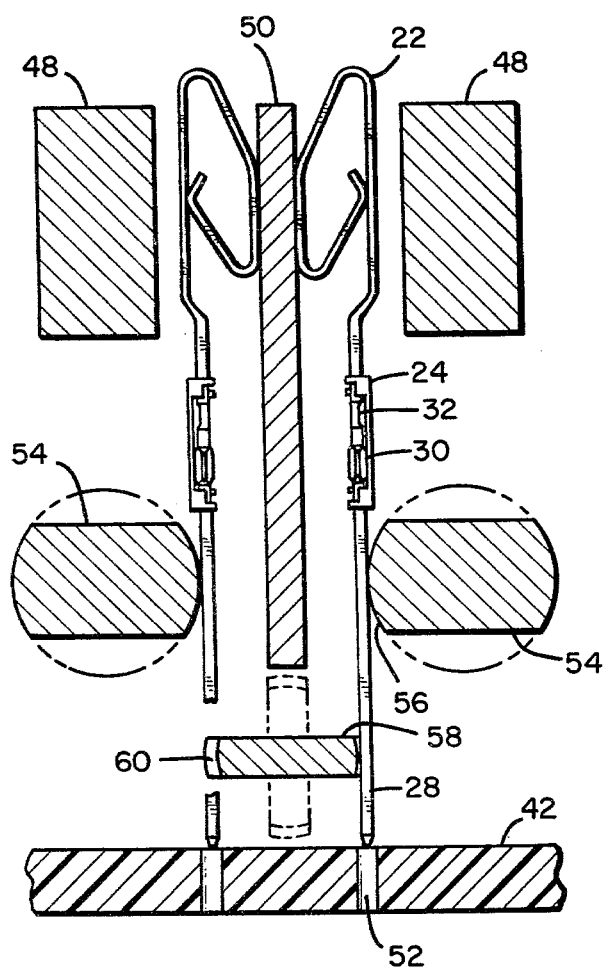
FIG. 6 is a diagram illustrating the manner by which the alignment tool shown in FIG. 3 aligns terminals for insertion into the substrate.
Figure 4:
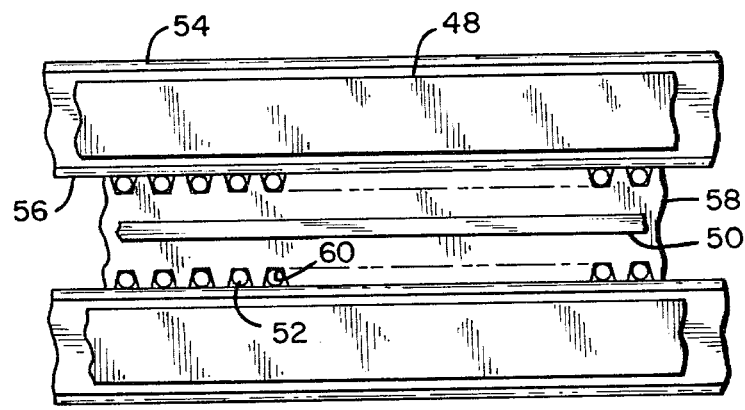
FIGS. 4 and 5 are detailed views of portions of the alignment tool illustrated in FIG. 3.

Similarly, positioning rods 58 include shanks (not shown) extending through the opposite end plate 47 and having a similar pin and actuator rod assembly as shown in FIG. 5 for rotating the positioning rods 58 between a first position shown in solid lines FIG. 6 and a second position shown in dashed lines in FIG. 6. The actuator rod for rotating positioning rods 58 is actuated by knob 72.

In the operation of the alignment tool shown in FIGS. 3–6, load rods 54 and positioning rods 58 are rotated to the position shown in dashed lines in FIG. 6 thereby forming slots between spacer bars 48 and separator bars 50. An assemblage 20 having a desired number of connector terminals supported by a bandolier is placed in each space, with the contact heads facing the separator bars. With the assemblages 20 in place, and the ends of shanks 28 resting against the upper surface of substrate 42, positioning rods 58 are rotated to the position shown in solid lines in FIG. 6 to thereby spread the shanks to the approximate positions of apertures 52.

Knob 70 is then actuated to rotate load rods 54 so that arcuate surfaces 56 of the load rods bear against an outside edge of shanks 28 to thereby position the shanks 28 directly above apertures 52 in the substrate as shown in FIG. 6. The length of the shanks 28 are such that the upper portion of the heads of connector terminals 22 will protrude above the uppermost surface of spacer bars 48 and separator bars 50. Thus, when in a position shown in FIG. 6, the heads of connector terminals 22 protrude slightly above the uppermost surface of the alignment tool when the pins are aligned with but not yet inserted into apertures 52. A slight pressing by hand onto the top of the plurality of connector heads will now insert each of the pins into apertures 52 so that the tips of shank 28 are located within apertures 52.

Figure 7:
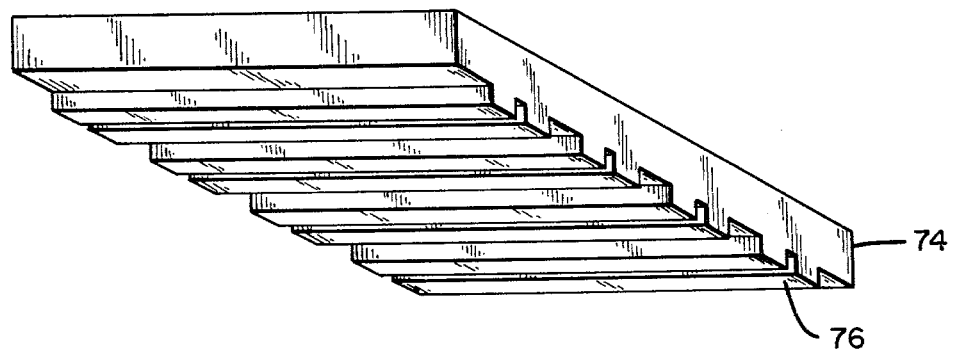
FIG. 7 is a perspective view of a pressing tool for pressing the terminals into the substrate.

A pressing tool 74, shown particularly in FIG. 7, is then positioned over the upper surface of alignment tool 42. Pressing tool 74 includes protrusions 76 in alignment with the spaces between spacer bars 48 and separator bars 59 to bear against the heads of connector terminals 22 to further press the shanks 28 of the terminals into apertures 52. Preferably, load rods 54 are rotated back to the dashed position shown in FIG. 6 during the pressing with pressing tool 74. Thus, terminals 22 are pressed downwardly and further into apertures 52.

Pressing tool 74 is then removed, and positioning rods 58 are returned to the position shown in dashed lines in FIG. 6 and alignment tool 40 is removed. As a result, the pins are now partially inserted apertures 52 of substrate 42 and are ready for press fitting thereto.

With reference to FIGS. 8–11, there is illustrated an insertion tool 80 for press-fitting the connector terminals 22 into board 42. Tool 80 includes a first member 82 having a plurality of slots 84 and recessed neck portions 86 for receiving portions 88 and arms 90 of cam members 92 and 94. Pins 95 (FIG. 11) extend through apertures 96 in members 92 and 94, and through apertures (not shown) extending between neck portions 86 and through slots 84 of member 82, to pivotally fasten cam members 92 and 94 to member 82. As shown particularly in FIG. 11, cam members 92 and 94 have outer surfaces 98 and 100 each having portions 102 and 104 disposed at an obtuse angle to form a camming surface. Slots 106 are formed in the lower arm portions of cam members 92 and 94 to receive the shanks 28 of connector terminals 22.

Member 82 also includes, at each end, a semi-spherical surface 108 adapted to be received in a ball-and-socket arrangement formed by semi-spherical surfaces 110 of member 112. Member 82 includes a longitudinal slot (not shown) to enable assemblage of member 82 to member 112 so that the extended body portion 114 of member 112 is received in the longitudinal slot of member 82 and cam members 92 and 94, fastened to member 82, are disposed on each side of body portion 114. Body portion 114 includes a plurality of slot portions 116 for receiving the bellows contact heads 26 of terminals 22. Surface 118 of member 112 forms a downward limiting stop for travel of member 82 and stop members 120 fastened to member 112, form an upward limiting stop for travel of member 82.

Cam actuator member 122 is assembled over shaft 124 on member 82. Cam actuators consisting of rollers 126 fastened to relatively strong leaf springs 128 are fastened to member 122. Rollers 126 are arranged to engage and bear against the camming surfaces 98 and 100 of cam members 92 and 94.

Preferably, a compression spring (not shown) is disposed about shaft 124 to bias camming member 122 upwardly from member 82. Thus, in its rest position the cam members 98 and 100 are in their "open" position as shown at the left portion of FIG. 11. Preferably, a handle (not shown) is fixedly fastened to the upper end of shaft 124 to form an upward limiting stop for travel of member 122 along shaft 124. The downward movement of member 122 in relation to member 82 is governed by the respective mating surfaces thereof.

Figure 11:
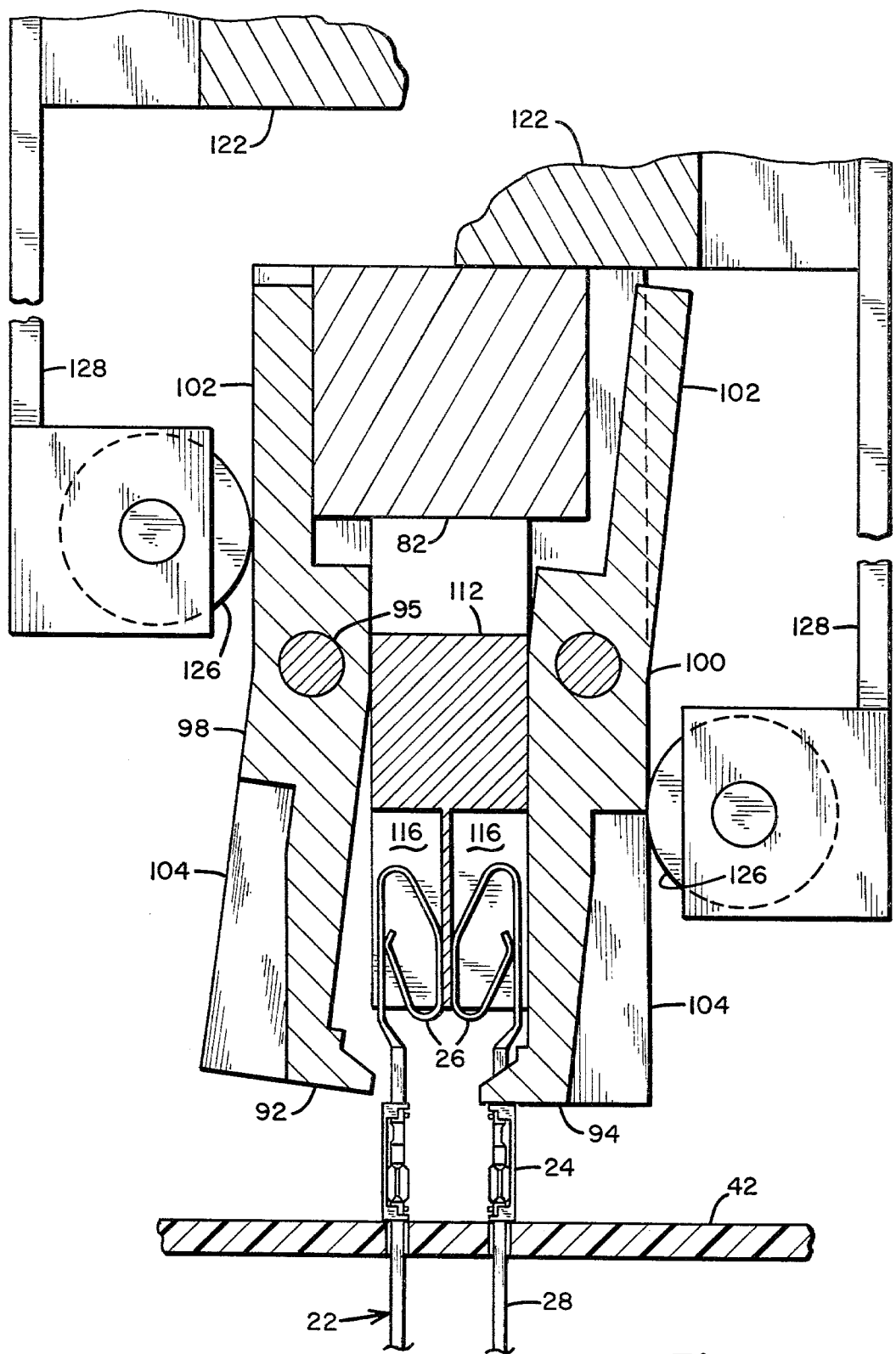
FIG. 11 is a cross-section view of a portion of the insertion tool shown in FIGS. 8 and 9, illustrating the manner that the tool is readied for insertion of the terminals.

FIG. 11 illustrates the camming action of insertion tool 80; the left-hand portion of FIG. 11 illustrating the tool in its rest position and the right-hand portion of FIG. 11 illustrating the tool in its actuation position. (It is understood that the tool is operated between its rest and actuation positions, and that FIG. 11 is divided to illustrate both conditions for sake of simplicity of illustration.) After the connector terminals 22 are inserted and pressed down by the tools illustrated in FIGS. 3–7 and the alignment and pressing tools are removed as heretofore described, the connector terminals 22 are arranged in essentially the position illustrated in FIG. 11 with the bandoliers 24 at or above the upper surface of the receiving substrate 42. Insertion tool 80 is then positioned over the assemblage of terminals 20 so that the heads 26 of the terminals are received in slots 116 in member 112 of tool 80. The lowermost surface of member 12 rests against the receiving substrate 42. The tool is now ready to insert terminals 20 to the substrate 42 to press-fit the sections 30 in receiving apertures 52 and to break away bandolier 24 from the terminals. This is accomplished by the downward movement of member 122 in a singular downward stroke to first engage the cam members 92 and 94 to engage the shanks of terminals and thereafter bear against bandolier 24 and then sections 32 of the terminals to break away the bandolier and press the terminals to their finally assembled positions in substrate 72. The entire sequence may be understood with reference to FIGS. 11 and 12.

In the initial downward travel of member 22, rollers 126 move from engagement with cam surface 102 to engagement with cam surface 104, thereby pivoting the cam members about their respective pivot points formed by pins 95 (compare the left and right portions of FIG. 11). Slots 106 of cam members 92 and 94 engage shanks 28 of the terminals above the bandolier. Continued downward movement of member 122 bring the assemblage to the condition shown at the right portion of FIG. 11 with member 122 bearing against member 82 and the lowermost surface of cam members 92 and 94 bearing against the upper surface of bandoliers 24. If the lower surfaces of the bandoliers are spaced above the upper surface of substrate 42, continued downward movement of member 122 will press against member 82, thereby accomplishing downward movement of the cam members to force the terminals downwardly until the bandolier rests against substrate 42. As will be appreciated, substrate 42 forms a limit to the downward travel of bandolier 24 so any further downward movement of the insertion tool will force the terminals downward and break the bandolier away from the terminals. It will be appreciated that as member 82 moves downwardly within member 112, the ball-and-socket arrangement of surfaces 108 and 110 permits correction of any minor misalignment between the members.

Figure 8:
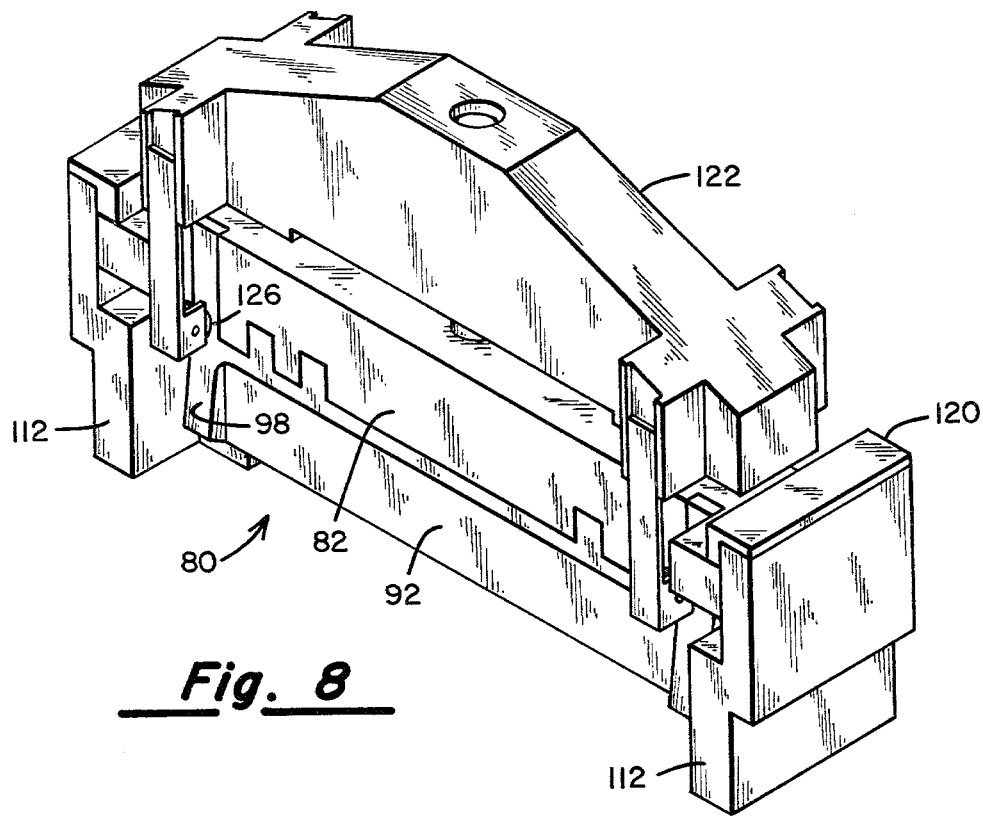
FIGS. 8 and 9 are perspective views of an insertion tool for press-fitting aligned terminals into the substrate and for removing the bandolier, FIG. 8 being an assembled view and FIG. 9 being an exploded view.
Figure 10:
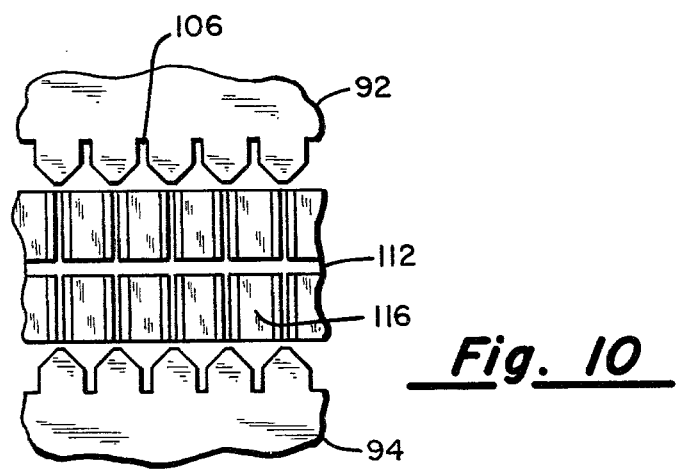
FIG. 10 is a detailed view of a portion of the insertion tool shown in FIGS. 8 and 9.
Figure 9:
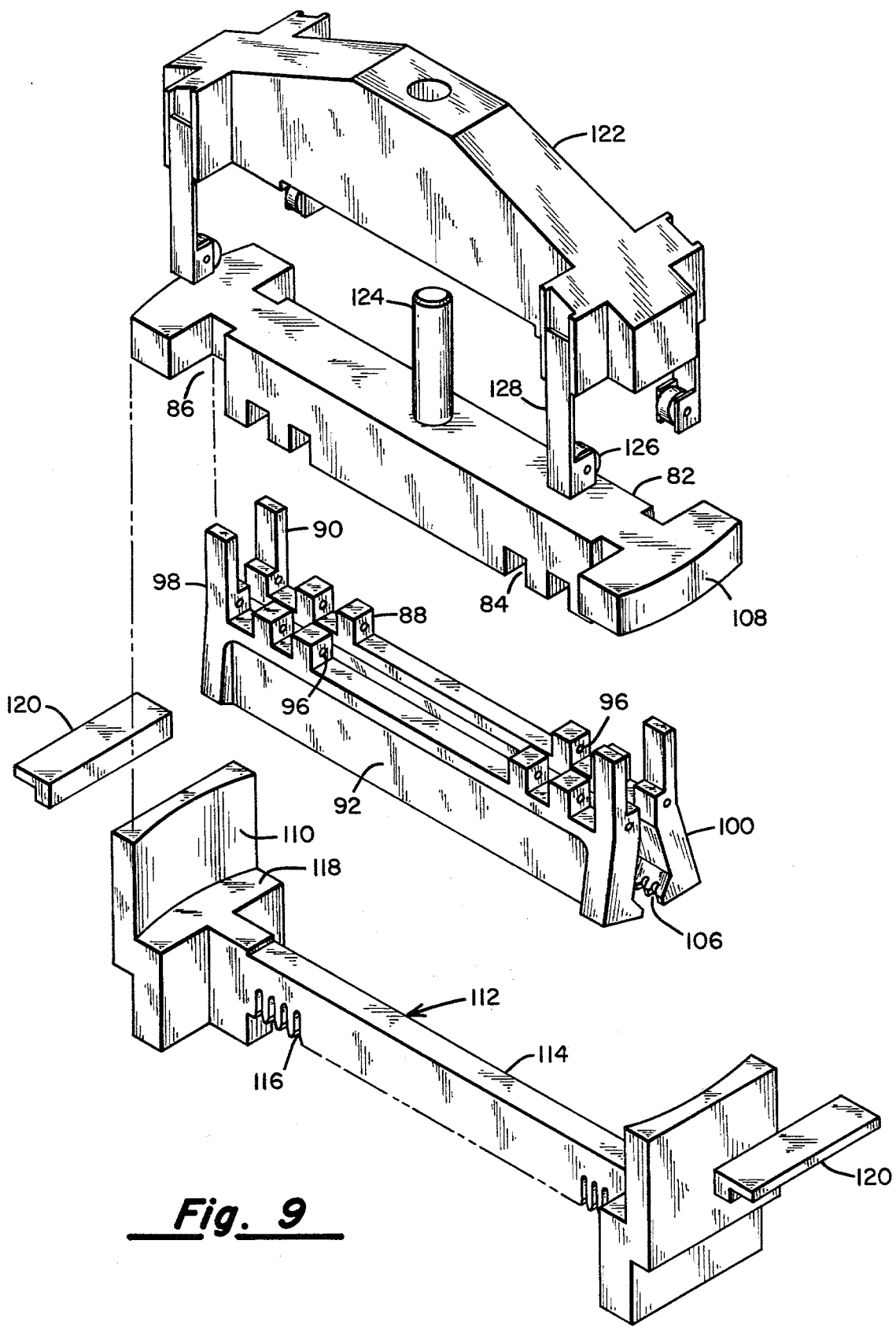

As shown particularly in FIG. 8 (and with reference to FIG. 9), member 82 is slidably mounted within, and supported by, member 112. Particularly, the arcuate surfaces 108 and 110 permit vertical sliding of the mating members, while at the same time permit a minor degree of "rocking" of member 82 so that the cam members 92 and 94 may conform to minor misalignment of the tool to the terminals. The relationship of members 82 and 112 is such that as member 122 is pressed downwardly, the cam members 92 and 94 first move to their actuated or closed position to engage the shanks of the terminals above the uppermost crimp sections, and continued downward movement causes member 82 to carry the cam members downwardly to first remove the bandolier and thereafter to press the terminals into the apertures. Thus, with the lowermost surface of member 112, downward movement of member 122 will first move the cam members to their actuated position to engage the shanks of the terminals and thereafter move member 82 and the cam members downwardly to a final position such that the lowermost surface of the cam members is immediately above the surface of the substrate.

Figure 12A:
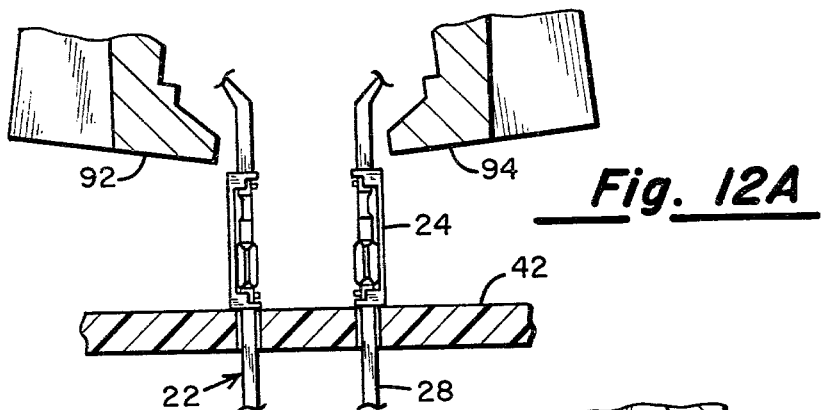
FIGS. 12A–12D are diagrams illustrating the manner by which the insertion tool shown in FIGS. 8 and 9 press-fit the terminals to the substrate and removes the bandolier.
Figure 12B:
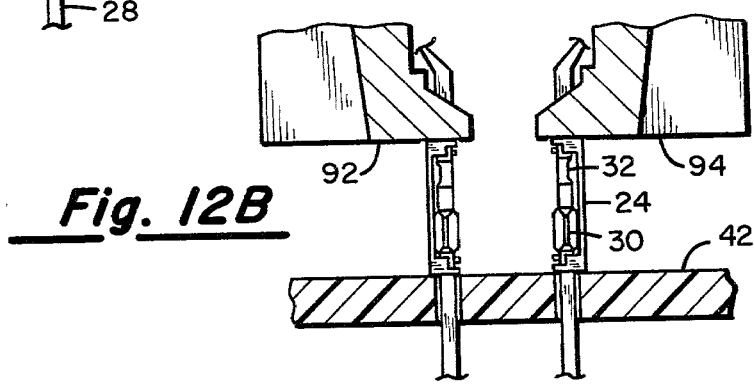
Figure 12C:
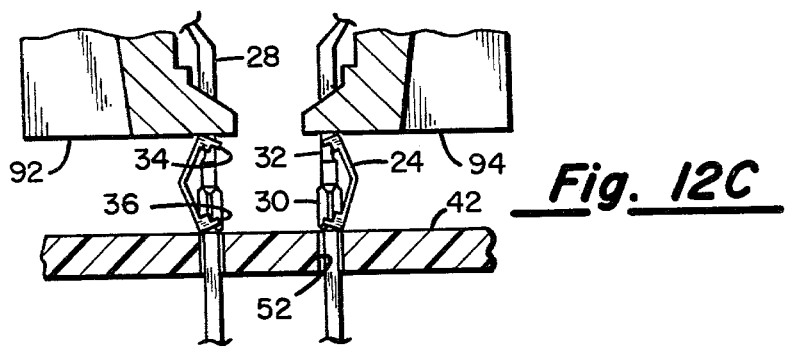
Figure 12D:
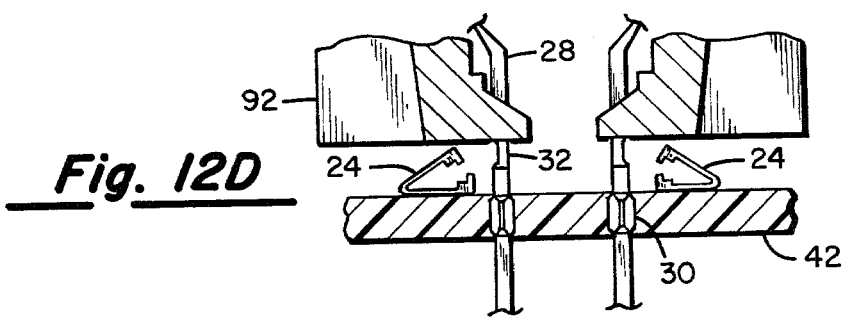

FIGS. 12A through 12D illustrate the sequence of insertion (press-fitting) the terminals to the substrate 42 and for removing the bandolier. FIGS. 12A and 12B illustrate the assemblage of the insertion tool 80 as shown in the left and right portions, respectively, in FIG. 11. Further downward movement of member 122, and consequently of cam members 92 and 94, will compress bandolier 24 between the lower surface of the members 92 and 94 and the upper surface of substrate 42. The bandolier will first bend along a line generally through the centers of apertures 38 in the bandolier (FIG. 2). As the bandolier bends to a folded position, the arms of the upper crimp 34 will open due to engagement with the enlarged section 32 on the terminal, and the arms of the lower crimp 36 will open due to engagement with the enlarged section 30 on the terminal, thereby freeing the bandolier from the terminal. Downward movement of the cam members 92 and 94 continues until the members bear against the shoulders formed by section 32. This condition is illustrated in FIG. 12C.

Continued downward movement of members 92 and 94 is now translated directly to the terminals, so the bandolier will continue to fold. As the terminals move downward so that enlarged section 30 is brought to the upper surface of substrate 42 at the entrance to aperture 52, the arms of the crimp sections completely open to thereby free the bandolier from the terminals. This condition is also illustrated in FIG. 12C. The bandolier 24 will now fall away (FIG. 12D), and continued downward movement of member 92 and 94 will bear against shoulders 32 to press the enlarged sections 30 into the apertures 52 of the substrate. It will be appreciated that the operation of tool 80 may be accomplished with one continuous downward motion of member 122.

Insertion tool 80 may now be removed, and the freed bandoliers cleared away. The substrate will remain with freestanding connector terminals press-fitted thereto, in readiness for a housing to be assembled thereto to complete the connector assembly as described in the Langham patent.

The present invention thus provides a simple mechanism and technique for inserting connector terminals onto a substrate for a connector assembly as described by the Langham patent. The apparatus and technique are effective and reliable. Using the tools according to the present invention, alignment of terminals has been accomplished at rates of about 20,000 terminals per hour and press-fitting has been accomplished at rates of about 30,000 terminals per hour, as opposed to 5,000 terminals aligned and 8,000 terminals per hour press-fitted using prior techniques.

This invention is not to be limited by the embodiment shown in the drawings and described in the description, which is given by way of example and not of limitation, but only in accordance with the appended claims.

What is claimed is:

1. Apparatus for press-fitting a plurality of connector terminals into individual apertures in a substrate, said connector terminals each having a contact head, a shank and an enlarged section on said shank for press-fitting in an aperture, the shanks of said terminals being fastened to a bandolier strip in predetermined spaced relation by crimp sections on said strip fastened to said shanks on each side of said enlarged sections, said apertures being aligned in a row in essentially the same predetermined space relation, said apparatus comprising:

alignment means aligning the shanks of said apertures with individual ones of said apertures; and pressing means for pressing initially against the upper crimp sections so that the lower crimp sections bear against said substrate to fold said bandolier strip to open said crimp sections by reaction against said enlarged section, and for thereafter pressing against said enlarged sections on said shanks to press said enlarged sections into said apertures.

2. Apparatus according to claim 1 wherein said alignment means comprises:

a housing adapted to be positioned on said substrate, said housing having a slot for positioning over said row of apertures and for receiving said terminals supported by said support strip;

positioning means supported by said housing adjacent one side of said slot, said positioning means being operable between a rest position and an actuated position, said positioning means having a plurality of notches each engaging individual ones of said shanks of said terminals in said slot when said positioning means is in its actuated position;

load means supported by said housing adjacent the opposite side of said slot, said load means being operable between a rest position and an actuated position, said load means having a surface for engaging said shanks of said terminals in said slot when said load means is in its actuated position, whereby when said load means is in its actuated position said surface of said load means engages said shanks of said terminals to bias said shanks toward said positioning means, said load means and said notches in said positioning means being disposed in relation to said apertures as to align said shanks of said terminals with individual apertures in said substrate when said load means and said positioning means are in their respective actuated positions; and actuator means for moving said load means and said positioning means between their respective rest and actuated positions.

3. Apparatus according to claim 2 wherein said slots are arranged in slot pairs, said substrate having a pair of rows of apertures for receiving terminals corresponding to each slot pair, said positioning means being supported between said slots of said slot pair and having a plurality of notches for engaging individual shanks of said terminals in each of said slots when said positioning means is in its actuated position, said load means comprising first and second load members adjacent the opposite side of each respective slot.

4. Apparatus according to claim 3 wherein said load members each comprise a load rod having an arcuate load surface, said load rods being rotatable between a rest position wherein said shanks of said terminals are free of said load rod and an actuated position wherein load surface engages said shanks of said terminals, said actuator means being operable to rotate said load rods between their rest and their actuated positions.

5. Apparatus according to claim 3 wherein said positioning means comprises a positioning rod positioned between individual ones of said slot pair, said positioning rod being relatively flat and said plurality of notches being disposed at the edges thereof for engaging the shanks of said terminals in each of said slots, said positioning rod being rotatable between a rest position wherein said shanks of said terminals are free of said positioning rod and an actuated position wherein said shanks of said terminals are engaged by said positioning rod within individual notches thereof, said actuator means being operable to rotate said positioning rod between its rest and its actuated positions.

6. Apparatus according to claim 5 wherein said load members each comprise a load rod having an arcuate load surface, said load rods being rotatable between a rest position wherein said shanks of said terminals are free of said load rod and an actuated position wherein said load surface engages said shanks of said terminals, said actuator means being operable to rotate said load rods between their rest and their actuated positions.

7. Apparatus according to claim 6 wherein said actuator means comprises first operable means engaging all of said load rods for simultaneously rotating all of said load rods between their rest and their actuated positions, and second operable means engaging said positioning rod for rotating said positioning rod between its rest and its actuated positions, said first and second operable means being separately operable whereby said load rods and said positioning rod are separately rotatable between their respective rest and actuated positions.

8. Apparatus according to claim 2 wherein said terminals are arranged in a pair of rows with the terminal pairs having contact heads facing each other, said pressing means comprising:
 a first member;
 first and second cam members pivotally mounted to said first member for movement between a rest position and an actuated position, said cam members having a plurality of notches each receiving a portion of a respective shank of one of said terminals when said cam members are in their actuated position;
 cam operator means supported by said first member for moving said first and second cam members from their rest to their actuated position; and
 a second member supporting said first member in sliding relation so that upon positioning said first member over the terminals, operation of said cam operator means moves said first and second cam members to their actuated position so that a portion of each of the shanks of said terminals is received in individual ones of said notches above said enlarged section, and subsequent movement of said first member downwardly toward said substrate will cause said cam members, carried by said first member, to engage the uppermost crimp sections to fold said bandolier strip so that said crimp sections open by reaction against said enlarged sections thereby separating said bandolier strips from said shanks and thereafter to engage an upper surface of each of said enlarged sections to force said terminals downward and to press said enlarged sections into the respective aperture.

9. Apparatus according to claim 8 wherein said first and second cam members have respective cam surfaces, and said cam operator means comprises a third member slidably mounted to said first member and roller means supported by said third member bearing against said cam surfaces so that upon movement of said third member in relation to said first member said roller means bear against said cam surfaces to move said cam members between their rest and actuated position.

10. Apparatus according to claim 1 wherein said terminals are arranged in a pair of rows with the terminal pairs having contact heads facing each other, said pressing means comprising:
 a first member;
 first and second cam members pivotally mounted to said first member for movement between a rest position and an actuated position, said cam members having a plurality of notches each receiving a portion of a respective shank of one of said terminals when said cam members are in their actuated position;
 cam operator means supported by said first member for moving said first and second cam members from their rest to their actuated position; and
 a second member supporting said first member in sliding relation so that upon positioning said first member over the terminals, operation of said cam operator means moves said first and second cam members to their actuated position so that a portion of each of the shanks of said terminals is received in individual ones of said notches above said enlarged section, and subsequent movement of said first member downwardly toward said substrate will cause said cam members, carried by said first member, to engage the uppermost crimp sections to fold said bandolier strip so that said crimp sections open by reaction against said enlarged sections thereby separating said bandolier strip from said shanks and thereafter to engage an upper surface of each of said enlarged sections to force said terminals downward and to press said enlarged sections into the respective aperture.

11. Apparatus according to claim 10 wherein said first and second cam members have respective cam surfaces, and said cam operator means comprises a third member slidably mounted to said first member and roller means supported by said third member bearing against said cam surfaces so that upon movement of said third member in relation to said first member said roller means bear against said cam surfaces to move said cam members between their rest and actuated position.

12. The method of press-fitting a plurality connector terminals in individual apertures in a substrate wherein said terminals each have a shank with an enlarged section, the shanks of said terminals being fastened to a bandolier strip by crimp sections on each side of said enlarged sections, said method comprising:
 aligning the shanks of said terminals with individual ones of said apertures;
 pressing initially on the upper crimp sections to fold said bandolier strip away from said terminals to thereby open said crimp sections by reaction against said enlarged sections; and thereafter pressing on said enlarged sections to press said enlarged sections into said apertures.

13. The method according to claim 12 wherein the pressing on the upper crimp sections occurs until the lower crimp sections engage the substrate so that continued pressing on the upper crimp section folds the bandolier strip by reaction against the substrate.

* * * * *

UNITED STATES PATENT AND TRADEMARK OFFICE
CERTIFICATE OF CORRECTION

PATENT NO. : 4,316,321

DATED : February 23, 1982

INVENTOR(S) : Thomas J. Wickham

It is certified that error appears in the above—identified patent and that said Letters Patent is hereby corrected as shown below:

Column 8, line 20 for "apertures" read --terminals--

*Signed and Sealed this*

*Tenth* Day of *August 1982*

[SEAL]

*Attest:*

GERALD J. MOSSINGHOFF

*Attesting Officer*     *Commissioner of Patents and Trademarks*